(12) United States Patent
Kim et al.

(10) Patent No.: US 6,420,744 B1
(45) Date of Patent: Jul. 16, 2002

(54) FERROELECTRIC CAPACITOR AND METHOD FOR FABRICATING FERROELECTRIC CAPACITOR

(75) Inventors: Hyun-Ho Kim; Ki-Nam Kim, both of Kyunggi do (KR)

(73) Assignee: Samsung Electronics Co., Ltd., Kyunggi-Do (KR)

( * ) Notice: Subject to any disclaimer, the term of this patent is extended or adjusted under 35 U.S.C. 154(b) by 0 days.

(21) Appl. No.: 09/712,159

(22) Filed: Nov. 15, 2000

(30) Foreign Application Priority Data

Nov. 16, 1999 (KR) .............................. 99-50848

(51) Int. Cl.7 .................. H01L 29/76; H01L 29/94; H01L 31/062; H01L 31/113
(52) U.S. Cl. .................................. 257/295; 257/906
(58) Field of Search ............................. 257/295, 296, 257/298, 300, 301, 302, 303, 306, 906, 907, 908

(56) References Cited

U.S. PATENT DOCUMENTS

| | | | | |
|---|---|---|---|---|
| 5,694,353 A | * | 12/1997 | Koike | 365/145 |
| 5,943,256 A | * | 8/1999 | Shimizu et al. | 365/145 |
| 5,998,825 A | * | 12/1999 | Ochiai | 257/311 |
| 6,097,051 A | * | 8/2000 | Torii et al. | 257/306 |
| 6,151,242 A | * | 11/2000 | Takashima | 365/145 |

* cited by examiner

Primary Examiner—David Nelms
Assistant Examiner—David Nhu
(74) Attorney, Agent, or Firm—Volentine Francos, PLLC

(57) ABSTRACT

A method of forming a semiconductor device wherein a dummy cell region is defined at a periphery of a cell array region that includes a ferroelectric capacitor. A dummy capacitor is formed simultaneously at the dummy cell region when a ferroelectric capacitor is formed at the cell array region. Accordingly, plasma etching damage and electrical charge generation are concentrated on the dummy capacitor, thereby reducing plasma etching damage and electrical charge generation at the ferroelectric capacitor of the cell array region.

4 Claims, 8 Drawing Sheets dummy cell region | cell array region dummy cell region | cell array region

FERROELECTRIC CAPACITOR AND METHOD FOR FABRICATING FERROELECTRIC CAPACITOR

The present application claims priority under 35 U.S.C. §119 to Korean Patent Application No. 99-50848, filed on Nov. 16, 1999, which is hereby incorporated by reference in its entirety for all purposes.

BACKGROUND OF THE INVENTION

1. Field of the Invention

The present invention relates to a semiconductor device and fabrication method thereof, and more particularly to a ferroelectric capacitor and a method of forming the ferroelectric capacitor.

2. Description of the Related Art

Modern data processing systems require that a substantial portion of the information stored in memory be randomly accessible to ensure rapid access to such information. Due to the high speed operation of memories implemented in semiconductor technologies, ferroelectric random access memories(FRAMs) have been developed. FRAMs exhibit a significant advantage of being nonvolatile, which is achieved by virtue of the fact that a ferroelectric capacitor includes a pair of capacitor electrodes with a ferroelectric material therebetween which has two different stable polarization states which can be defined with a hysteresis loop depicted by plotting the polarization against applied voltage. The hysteresis loop characteristic may be varied depending on fabrication parameters of the FRAM.

FRAM fabrication methods include ferroelectric capacitor processes. Ferroelectric capacitor processes include plasma etching of electrode layers and a ferroelectric film interposed therebetween. Generation of electrical charge within the exposed layer during plasma etching is a well-known phenomena in the art. In particular, during FRAM fabrication, a capacitor stack (made of a lower electrode layer, a ferroelectric film and an upper electrode layer) exposed to plasma etching is subjected to plasma etching damage and electrical charge generation phenomenon occurs, thereby degrading the ferroelectric characteristic (hysteresis loop characteristic) of the ferroelectric film. The present inventors knew that due to the loading effect caused by the plasma characteristic, higher plasma potential is generated in the capacitor stack at outermost parts of the cell array region, as compared to at the cell array interior. Accordingly, plasma etching damage is mainly concentrated on the capacitor stack at outermost parts of the cell array region.

Due to such plasma damage at the outermost part of the cell array region, the ferroelectric characteristic of cell capacitors at the outermost parts of the cell array region is different than the ferroelectric characteristic of cell capacitors at the interior of the cell array region, as shown in FIG. 1. Comparing polarization level, the outermost cell capacitor has a significantly low polarization level as compared to the interior cell capacitor. Accordingly, a uniform and stable ferroelectric characteristic cannot be obtained throughout the cell array region, thereby reliable device performance cannot be secured.

Defects of the outermost cells of the cell array region originate because of the following two reasons. A first reason is generation of a damaged layer on the ferroelectric film. The other reason is charging of the capacitor stack. Because of these defects, the two stable polarization states of the ferroelectric film may become fixed at either one state or the other, resulting in reduction of the polarization level so that the cell cannot operate properly. Accordingly, there is a need for a method of forming a ferroelectric capacitor that is capable of preventing variation of ferroelectric characteristic.

SUMMARY OF THE INVENTION

The present invention is therefore directed to a ferroelectric capacitor and a method of fabrication thereof which substantially overcomes one or more of the problems due to the limitations and disadvantages of the related art.

Therefore, it is an object of the present invention to provide a method of forming a ferroelectric capacitor that can prevent degrading of the ferroelectric capacitor at outermost parts of a cell array region, and to thereby secure a stable ferroelectric characteristic throughout the cell array region.

It is another object of the present invention to provide a ferroelectric capacitor having a stable ferroelectric characteristic.

It is a feature of the present invention that a dummy cell capacitor is simultaneously formed at a dummy cell region provided at the periphery of the cell array region, when a cell capacitor is formed at a cell array region. Accordingly, the loading effect of the plasma etching process can be concentrated mainly on the dummy cell capacitor.

More particularly, in order to achieve the above-said objects of the present invention, a method of forming a ferroelectric capacitor includes providing a semiconductor substrate having a cell array region and a dummy region at a periphery of the cell array region; performing a device isolation process and defining a first active region in a selected portion of the cell array region; forming an interlayer insulating layer on an entire surface of the semiconductor substrate; forming a first contact plug, penetrating a selected portion of the interlayer insulating layer and being electrically connected to the first active region; forming a ferroelectric capacitor stack made of a lower electrode layer, a ferroelectric film and an upper electrode layer, in this order, on an entire surface of the interlayer insulating layer including the first contact plug; and plasma etching the capacitor stack and forming a ferroelectric capacitor to be electrically connected to the first contact plug at the cell array region, while concurrently forming a dummy ferroelectric capacitor at the dummy cell region.

Preferably, the device isolation process also defines a second active region in the dummy cell region of the substrate, and the forming of a first contact plug also includes forming a second contact plug to be electrically connected to the second active region through the interlayer insulating layer. At this time, the dummy ferroelectric capacitor is electrically connected to the second contact plug, such that a current path from the dummy ferroelectric capacitor to the second active region is generated.

The forming of an interlayer insulating layer on an entire surface of the semiconductor substrate includes forming a transistor on the first active region of the cell array region; forming a first insulating layer on the resultant structure having the transistor, to insulate the transistor; forming a bit line on the first insulating layer to be electrically connected to the first active region; and forming a second insulating layer on the second insulating layer and on the bit line. The bit line penetrates the first insulating layer and is electrically connected to the first active region on one side of the transistor, and the first contact plug penetrates the first and second insulating layers and is electrically connected to the first active region on another side of the transistor.

Herein, it is also preferable that the device isolation process also defines a second active region in the dummy cell region of the substrate, and the forming of a first contact plug also includes forming a second contact plug to be electrically connected to the second active region through the first and second insulating layers. The dummy ferroelectric capacitor is electrically connected to the second contact plug, such that a current path from the dummy ferroelectric capacitor to the second active region is generated.

In order to achieve the above described objects of the present invention, a method of forming a ferroelectric capacitor includes providing a semiconductor substrate having a cell array region and a dummy cell region at a periphery of the cell array region; performing a device isolation process and defining a first active region at the cell array region; forming a transistor on the first active region; forming a first insulating layer on the substrate and on the transistor; forming a bit line on the first insulating layer to be electrically connected to the first active region on one side of the transistor; forming a second insulating layer on the bit line and on the first insulating layer; forming a first contact plug in the second insulating layer, the first contact plug penetrating the second and first insulating layers and being electrically connected to the first active region on another side of the transistor; forming a ferroelectric capacitor stack made of a lower electrode layer, a ferroelectric film and an upper electrode layer in this order on an entire surface of the second insulating layer and on the first contact plug; and plasma etching the capacitor stack and forming a ferroelectric capacitor to be electrically connected to the first contact plug at the cell array region while concurrently forming a dummy ferroelectric capacitor at the dummy cell region, wherein a charging up phenomenon caused by plasma etching is concentrated on the second ferroelectric capacitor of the to dummy cell region.

It is preferable that the device isolation process also defines a second active region in the dummy cell region of the substrate, and the forming of a first contact plug also includes forming a second contact plug to be electrically connected to the second active region through the first and second insulating layers. The dummy ferroelectric capacitor is electrically connected to the second contact plug, such that a current path from the dummy ferroelectric capacitor to the second active region is generated, and the electrical charges generated within the dummy ferroelectric capacitor flow into the second active region of the dummy cell region through the second contact plug.

In order to achieve the above objects of the present invention, there is provided a ferroelectric capacitor including a semiconductor substrate having a cell array region and a dummy cell region provided at a periphery of the cell array region; a first active region formed at a selected portion of the cell array region of the semiconductor substrate; an interlayer insulating layer formed on an entire surface of the substrate; a first contact plug formed in a selected portion of the interlayer insulating layer to be electrically connected to the first active region; and a ferroelectric capacitor and a dummy ferroelectric capacitor formed on the interlayer insulating layer, the ferroelectric capacitor being formed over the cell array region to be electrically connected to the first contact plug.

The interlayer insulating layer can further comprise a transistor formed on the first active region, a first insulating layer formed on the transistor and on the substrate, a bit line formed on the first insulating layer and a second insulating layer formed on the first insulating layer and the bit line. The bit line penetrates the first insulating layer and is electrically connected to the substrate on one side of the transistor. The first contact plug penetrates a selected portion of the first and second insulating layers and is electrically connected to the first active region on another side of the transistor.

Preferably, the ferroelectric capacitor further includes a second active region in a selected portion of the dummy cell region wherein a second contact plug penetrates a selected portion of the interlayer insulating layer and is electrically connected to the second active region. The dummy ferroelectric capacitor is electrically connected to the second contact plug, such that an electrical path from the dummy ferroelectric capacitor to the second active region is generated.

It is an advantage of the present invention that plasma etching damage is mainly concentrated on the dummy cell region, and thus the outermost parts of the cell array region are substantially not subject to etching damage. Accordingly, ferroelectric capacitors with a stable ferroelectric characteristic can be obtained throughout the cell array region.

It is another advantage of the present invention that electrical charges generated on the dummy capacitor can easily flow out to the second active region formed at a semiconductor substrate of the dummy cell region through an electrical current path between the dummy cell capacitor and the second active region. Accordingly, plasma etching damage can be advantageously reduced.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
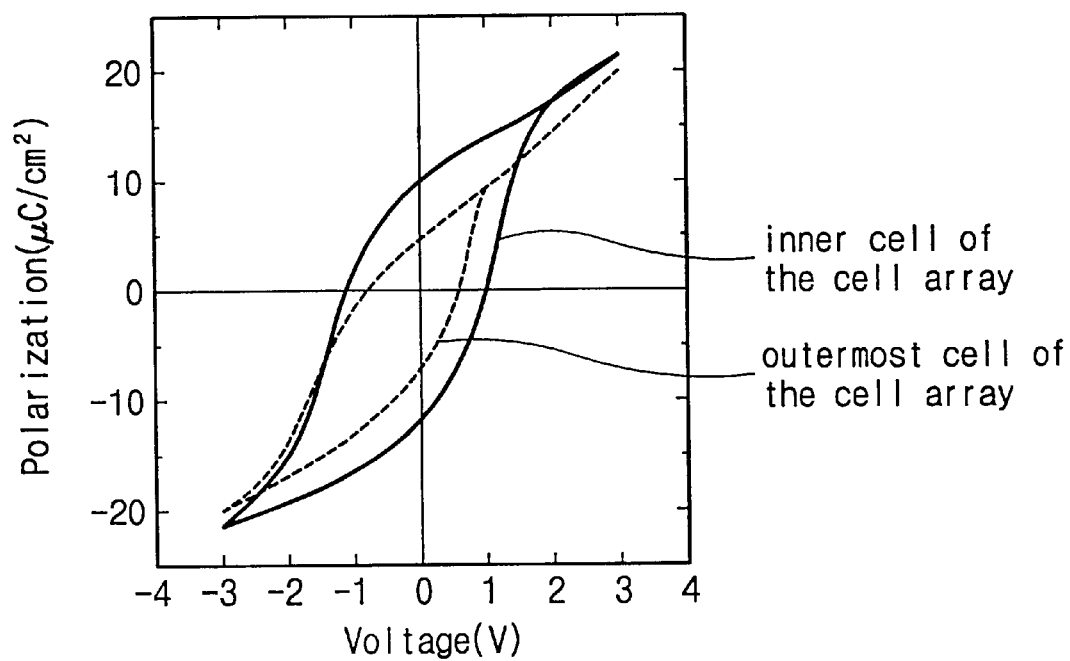
FIG. 1 schematically shows hysteresis loops of ferroelectric capacitors at outermost parts of a cell array region and at an interior of a cell array region.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present.

The present invention relates to a ferroelectric capacitor and a fabrication method thereof. In the present invention, a dummy cell capacitor at a dummy cell region provided at a periphery of the cell array region is formed simultaneously while a cell capacitor is formed at a cell array region. Accordingly, plasma damage, and consequently a charging up phenomenon, is concentrated on the dummy cell region which surrounds the outermost part of the cell array region, thereby minimizing the charging up phenomena at the outermost part of the cell array region. The ferroelectric capacitors in the cell array region can have a stable and uniform ferroelectric characteristics. In addition, in order for charges within the dummy capacitor to easily flow out into the substrate, an active region is formed at the dummy cell region as a guard ring, and provides an electrical path between the active region and the dummy capacitor.

Figure 2:
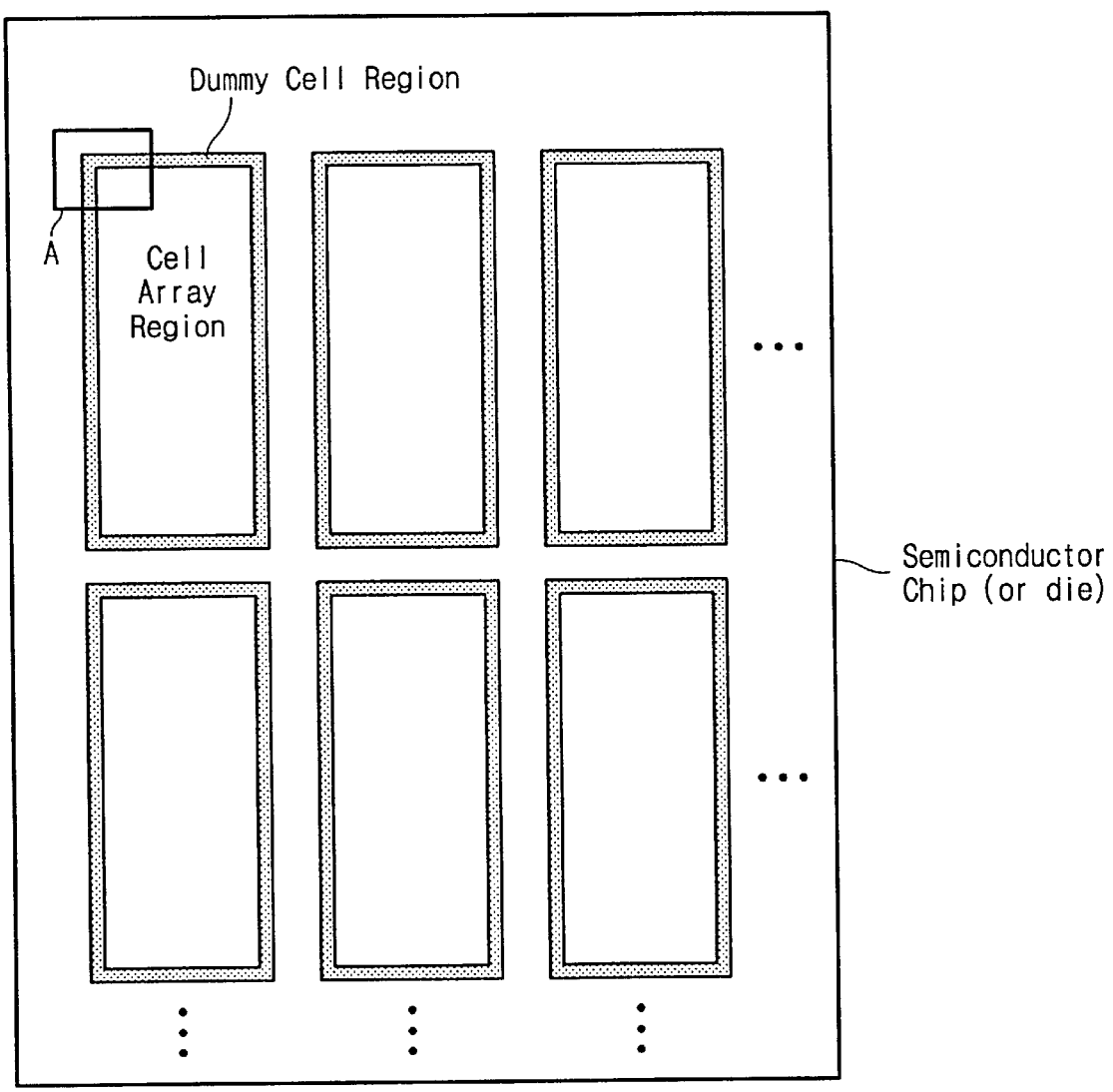
FIG. 2 is a schematic top plan view of a semiconductor chip having cell array regions and dummy cell regions at peripheries of the cell array regions, according to the present invention.

FIG. 2 schematically shows a chip (or die) having cell array regions and dummy cell regions surrounding the cell array regions (i.e., periphery of the cell array region). In the present invention, a ferroelectric capacitor (i.e., dummy pattern) is formed on the dummy cell region as well as on the cell array region (cell capacitor).

Figure 3:
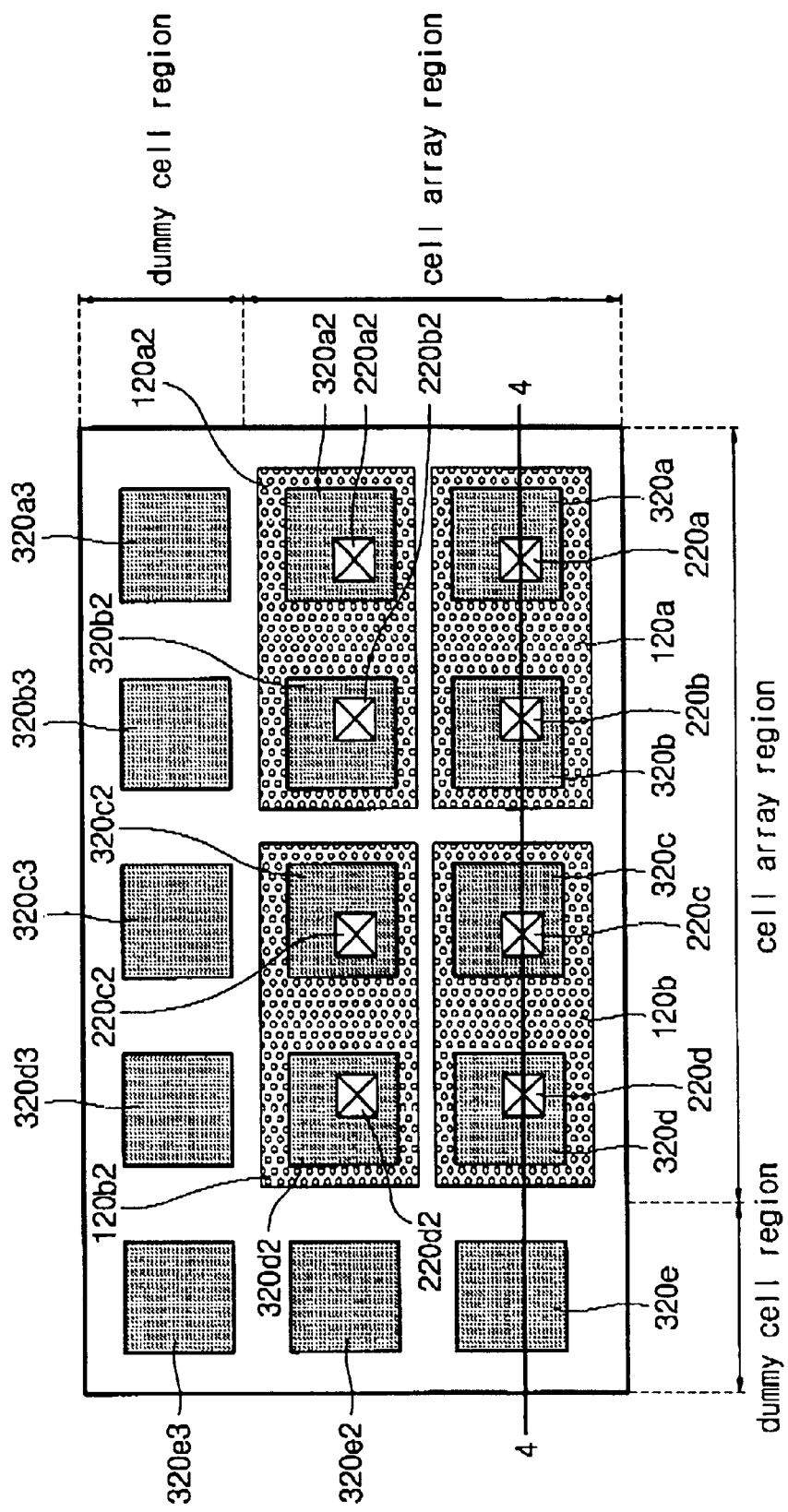
FIG. 3 is a partial enlarged view of the portion of FIG. 2 that is surrounded by a solid line indicated by reference mark "A", where a ferroelectric capacitor has been formed according to a first embodiment of the present invention.

FIG. 3 is a partial enlarged view of the portion of FIG. 2 that is surrounded by the solid line indicated by reference mark "A", where a ferroelectric capacitor has been formed according to a first embodiment of the present invention. FIGS. 4A to 4D are cross-sectional views taken along line 4—4 of FIG. 3, at selected stages of a method of forming a ferroelectric capacitor according to the first embodiment of the present invention.

Referring to FIG. 3, a cell array region, and a dummy cell region at a periphery of the cell array region, are defined. A plurality of ferroelectric capacitors 320a–320d, 320a2–320d2 are located at the cell array region, and a plurality of dummy capacitors 320e, 320e2, 320e3, 320a3–d3 are located at the dummy cell region. The ferroelectric capacitors 320a–320d, 320a2–320d2 at the cell array region are electrically connected to the active regions 120a, 120b, 120a2, 120b2 through contact plugs 220a–d, 220a2–d2. Though not shown in the drawings, a bit line and a word line are located at the cell array region as for data reading/wiring operation. In addition, a peripheral circuit (not shown) for controlling and driving the cell array region is located at a peripheral circuit region that is located at a periphery of the dummy cell region, and is electrically connected to the bit line and a word line through a predetermined pattern.

Figure 4A:
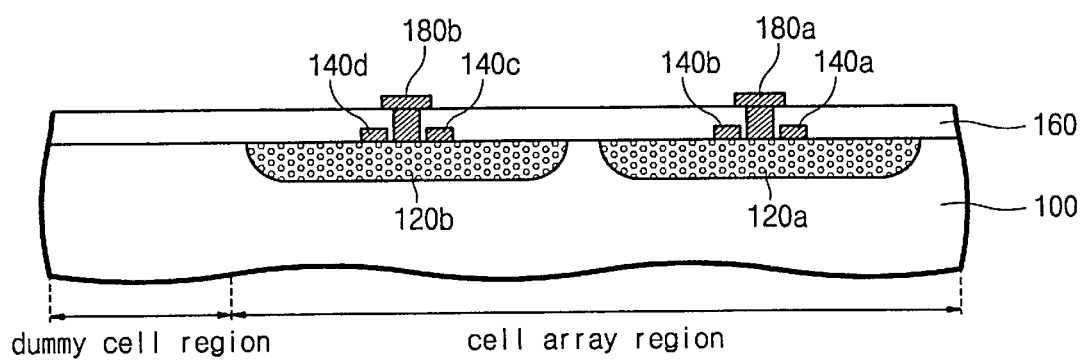
FIGS. 4A to 4D are cross-sectional views taken along line 4—4 of FIG. 3, at selected stages of a method of forming a ferroelectric capacitor according to the first embodiment of the present invention.
Figure 4B:
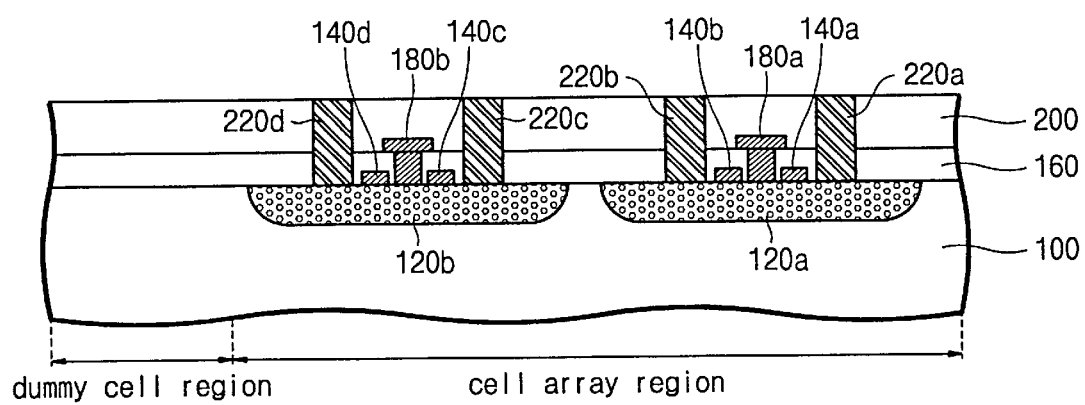
Figure 4C:
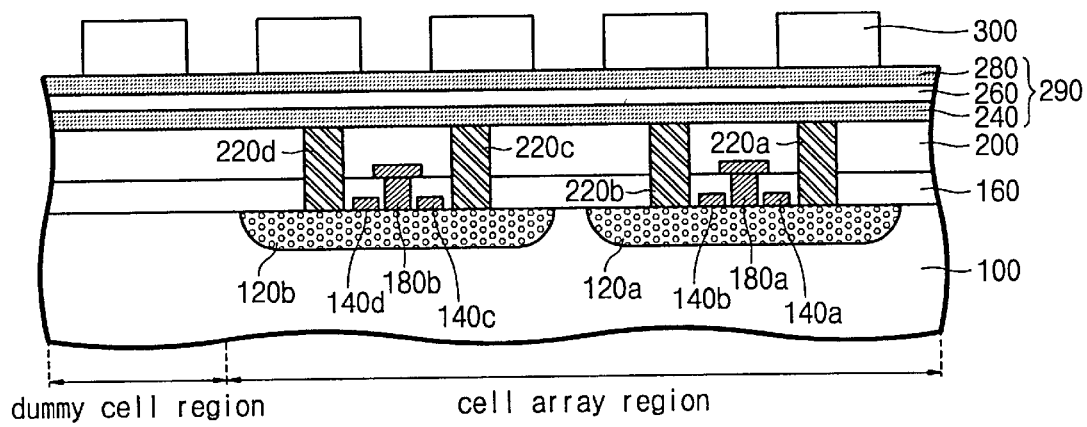
Figure 4D:
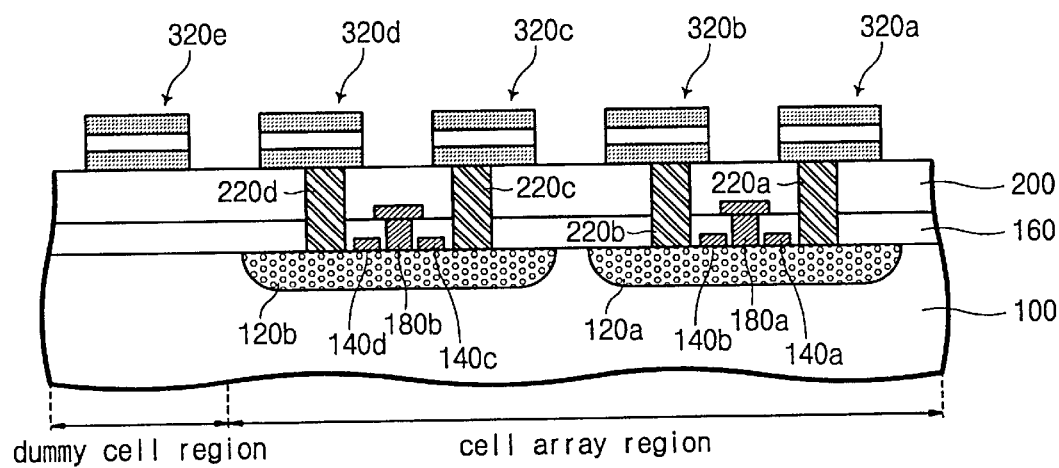

FIG. 4D is a cross sectional view of FIG. 3 taken along line 4—4. Referring to FIG. 4D, a ferroelectric memory device includes a semiconductor substrate 100 having a cell array region and a dummy cell region. First active regions 120a and 120b are located at predetermined regions of the cell array region. Composite interlayer insulating layer 160, 200 is disposed on an entire surface of the substrate 100. First contact plugs 220a–d penetrate selected portions of the interlayer insulating layer and are in contact with selected portions of the first active regions 120a–b. A plurality of ferroelectric capacitors 320a–d are disposed on the interlayer insulating layer and are electrically connected to the selected first contact plugs. Dummy capacitor 320e is disposed over the interlayer insulating layer at the dummy cell region.

Referring now to FIGS. 4A to 4D, a method of forming a ferroelectric capacitor shown in FIG. 3 will be described. A semiconductor substrate 100 having a cell array region and a dummy cell region is provided. For example, a p-type silicon substrate can be used. A device isolation process is performed to define active regions 120a and 120b at predetermined regions of the cell array region. The device isolation process can be LOCOS(local oxidation of silicon) or STI(shallow trench isolation) processes. A plurality of gate electrodes are formed on the active region. For example, a pair of gate electrodes 140a and 140b, 140c and 140d, are shown at each active region 120a, 120b, respectively. Each pair of the gate electrodes divides the active region into three parts. The gate electrode is formed of polysilicon, metal silicide, or a combination thereof.

Though not shown in the drawing, an insulator is formed between the substrate and the gate electrodes. In addition, by conventional implantation, impurity diffusion regions are formed in the active regions on both sides of the gate electrodes. At this time, the impurities exhibit opposite conductivity type with respect to the substrate. As a result of the implantation, source and drain regions are defined. Namely, at each active region, an impurity diffusion region between the gate electrodes corresponds to the common drain region, and the impurity diffusion regions on sides of the gate electrodes opposite the common drain region correspond to source regions. Accordingly, a gate electrode, a source region and the common drain region constitute a transistor. The gate electrode of the transistor serves as a word line. In addition, a gate capping layer and sidewall spacers are respectively formed on sidewalls and on a top surface of the gate electrodes to protect the gate electrodes. The sidewall spacers and the capping layer are formed of silicon nitride.

A first insulating layer 160 is formed on the resultant structure. The first insulating layer 160 is formed of a material that has an etching selectivity with respect to the gate protection layer. For example, a CVD oxide layer can be used. The first insulating layer 160 is then patterned to form bit line contact holes therein, exposing the common drain region. A bit line conductive material layer is deposited in the holes and on the first insulating layer 160, and patterned into desired configuration, thereby forming bit lines 180a and 180b. The bit line conductive material can be formed of polysilicon, refractory metal silicide, or a combination thereof. Though not shown, a bit line protection capping layer and sidewall spacers are formed on the top surface of the bit lines and on the sidewalls thereof. The bit line sidewall spacers and the capping layer are formed of a silicon nitride layer.

Referring now to FIG. 4B, a second insulating layer 200 is formed on the first insulating layer 160 and on the bit lines 180a and 180b. The second insulating layer 200 is formed of an oxide. The second and first insulating layers 200 and 160 are patterned to form lower electrode contact holes therein, exposing the source regions. A conductive material such as polysilicon is deposited in the contact holes and on the second insulating layer 200. In succession, a planarization process is carried out until a top surface of the second insulating layer 200 is exposed, thereby forming contact plugs 220a, 220b, 220c and 220d.

The next process sequence is the formation of the ferroelectric capacitors and the dummy capacitor. Referring to FIG. 4C, capacitor stack 290 comprising, a lower electrode layer 240, a ferroelectric film 260 and an upper electrode layer 280 is formed on the second insulating layer 200 having the contact plugs 220a–d. More particularly, the lower and upper electrode layers 240 and 280 can be made of a transition metal, or a conductive oxide electrode such as $RuO_2$ and $IrO_2$. The transition metal may include platinum, ruthenium, rhodium, or iridium. In addition, a combination of a transition metal and conductive oxide can be used. The ferroelectric film 260 is formed of a material that has a crystalline structure, i.e., perovskite crystalline, exhibiting hysteresis loop characteristic. For example, PZT, PLT, PLZT, SBT, BT, BLT or the like can be used.

Next, a photolithographic process is carried out to pattern the capacitor stack 290. First, photoresist layer pattern 300 is formed on the upper electrode layer 280. Using the photoresist layer pattern 300 as a mask, the capacitor stack 290, i.e., upper electrode layer 280, ferroelectric film 260 and lower electrode layer 240 is patterned to form ferroelectric capacitors 320a, 320b, 320c and 320d at the cell array region electrically connected to selected contact plugs 220a–d. At this time, it should be noted that dummy capacitor 320e is also formed at the dummy cell region. During patterning of the capacitor stack, a plasma gas such as a C—F based gas including $CF_4$, $CHF_3$, or a chlorine based gas such as $CCl_4$, may be used.

Since dummy capacitor 320e is also formed in the dummy cell region, plasma etching is also carried out at the dummy cell region, so that plasma etching damage and the charging up phenomenon thus become concentrated on dummy capacitor 320e of the dummy cell region. Plasma etching damage and the charging up phenomenon on the ferroelectric capacitors at the outermost parts of the cell array region are thus minimized. If the dummy capacitor at the periphery of the ferroelectric capacitor in an outermost part of the cell array region is absent, the plasma etching damage and the charging up phenomenon becomes concentrated on the ferroelectric capacitor in that outermost part of the cell array region. According to this embodiment of the present invention, ferroelectric capacitors with stable and uniform ferroelectric characteristic can be obtained throughout the cell array region.

Figure 5:
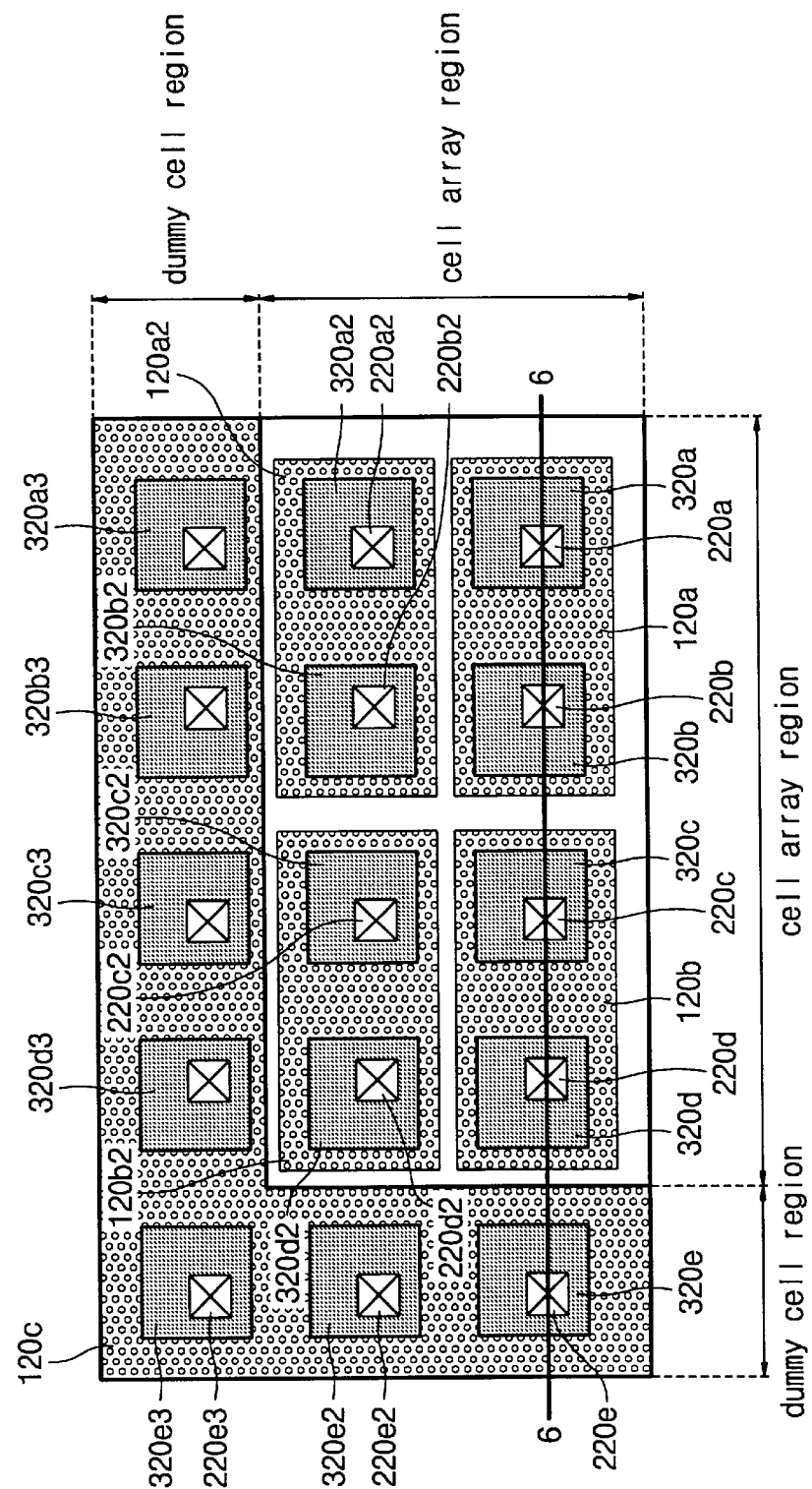
FIG. 5 is a partial enlarged view of the portion of FIG. 2 that is surrounded by a solid line indicated by reference mark "A", where a ferroelectric capacitor has been formed according to a second embodiment of the present invention.

FIG. 5 is a partial enlarged view of the portion of FIG. 2 surrounded by a solid line indicated by reference mark "A", where a ferroelectric capacitor has been formed according to a second embodiment of the present invention, and FIGS. 6A to 6D are cross-sectional views taken along line 6—6 of FIG. 5, at selected stages of a method of forming a ferroelectric capacitor according to the second embodiment of the present invention.

In FIG. 5 and FIGS. 6A to 6D, the same parts that function as shown in FIG. 3 and FIGS. 4A to 4D, are identified with the same reference numbers and their explanation is omitted.

A significant difference between the second embodiment and the first embodiment is that an active region is also formed in the dummy cell region, and the dummy capacitor is electrically connected to the active region through the electrical current path, thereby discharging charges stored within the dummy capacitor during plasma etching. The current path is simultaneously formed when the contact plugs for electrical connection between the ferroelectric capacitors and the active regions of the cell array regions are formed.

Comparing FIG. 3 and FIG. 5, the second embodiment of FIG. 5 further includes active region 120c and contact plugs 220e, 220e2, 220a3–e3 at the dummy cell region. FIG. 6D is a cross sectional view of FIG. 5 taken along line 6—6. Referring to FIG. 6D, the ferroelectric memory device includes a semiconductor substrate 100 having a cell array region and a dummy cell region. First active regions 120a and 120b are located at predetermined regions of the cell array region. Also, a second active region 120c is located at a predetermined region of the dummy cell region. Composite interlayer insulating layer 160, 200 is disposed on an entire surface of the substrate 100. First contact plugs 220a–d penetrate selected portions of the interlayer insulating layer and are in contact with the selected portions of the first active regions 120a and 120b. Second contact plug 220e penetrates a selected portion of the interlayer insulating layer and is in contact with the second active region 120c. A plurality of ferroelectric capacitors 320a–d are disposed on the interlayer insulating layer electrically connected to the selected first contact plugs. Dummy capacitor 320e is disposed over the interlayer insulating layer electrically connected to second contact plug 220e at the dummy cell region.

Now, the second embodiment of the present invention of forming a ferroelectric capacitor shown in FIG. 5 will be described with reference to FIGS. 6A to 6D. As in the first embodiment, a p-type semiconductor substrate 100 having a cell array region and a dummy gate region is provided. A device isolation process is carried out to define active regions 120a, 120b and 120c. Unlike the first embodiment, an active region 120c is formed at the dummy cell region (the second active region), as well as active regions 120a and 120b at the cell array region (the first active regions). A plurality of gate electrodes 140a–d are formed on the first active region of the cell array region. As in the first embodiment, conventional implantation is carried out to form impurity diffusion regions in the active regions 120a, 120b, and 120c. In the cell array region, impurity diffusion regions are divided into three parts, i.e., a common drain region between the gate electrodes and source regions on sides of the gate electrodes opposite the common drain region. The source and drain regions, and the gate electrode, constitute a transistor.

A first interlayer insulating layer 160 is formed on the resulting structure and patterned to form bit line contact holes therein, that expose the drain regions of the first active region 120a and 120b of the cell array region. Bit lines 180a and 180b are formed as in the first embodiment.

Figure 6A:
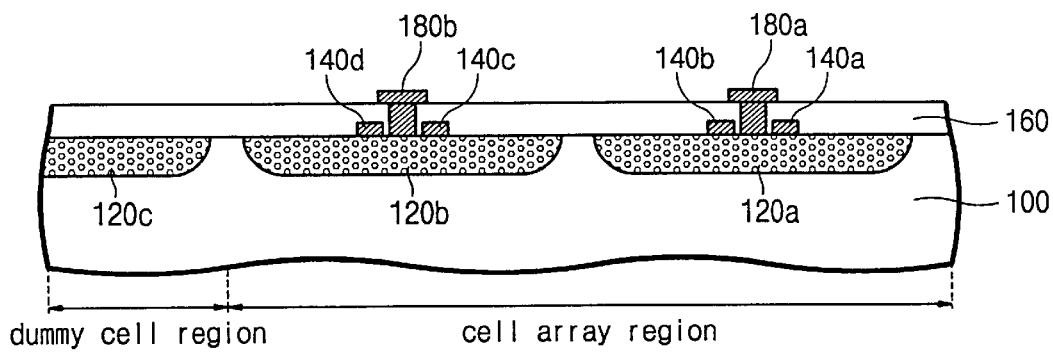
FIGS. 6A to 6D are cross-sectional views taken along line 6—6 of FIG. 5, at selected stages of a method of forming a ferroelectric capacitor according to the second embodiment of the present invention.
Figure 6B:
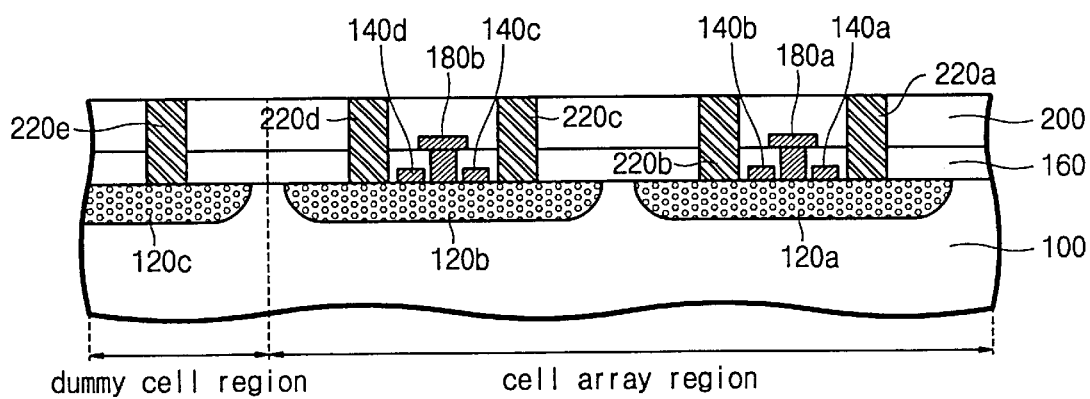

Referring now to FIG. 6B, a second insulating layer 200 is formed on the first insulating layer 160 including the bit lines 180a and 180b. The second insulating layer 200 is patterned to form contact holes therein. Unlike in the first embodiment, contact holes are formed also in the dummy cell region. Namely, contact holes formed in the cell array region expose source regions of the active regions 120a and 120b, and a contact hole formed in the dummy cell region exposes the active region 120c (i.e., n-type impurity diffusion region). A conductive material such as polysilicon is deposited on the second insulating layer 200 and in the contact holes, and is planarized until a top surface of the second insulating layer 200 is exposed, thereby forming first contact plugs 220a–d electrically connected to the first active regions 120a and 120b and forming second contact plug 220e electrically connected to the second active region 120c.

Figure 6C:
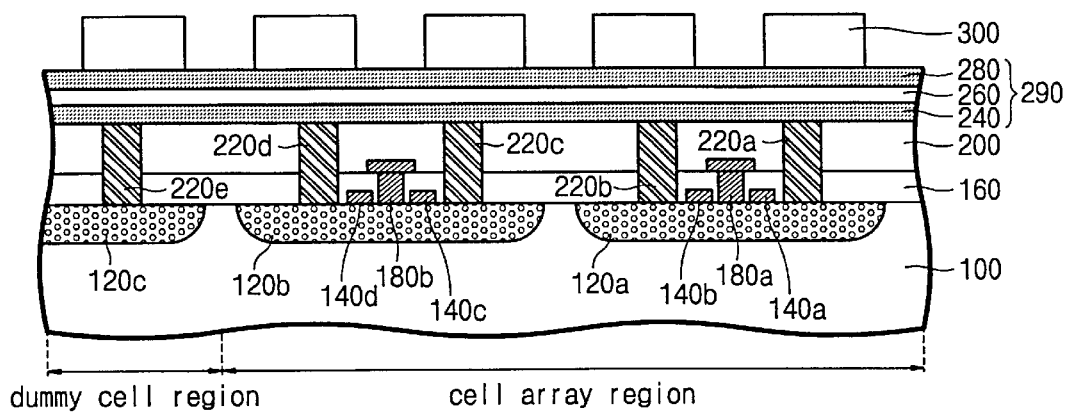
Figure 6D:
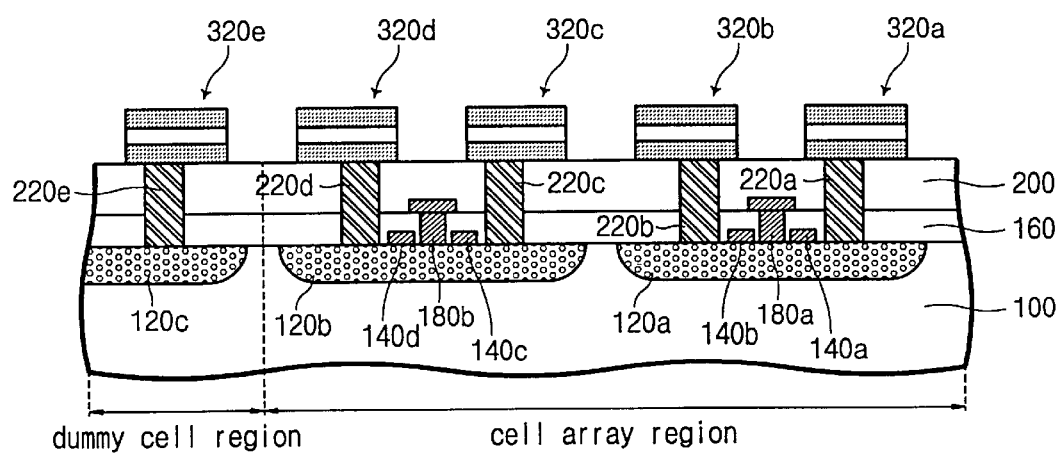

The next process sequence is the formation of ferroelectric capacitors and a dummy capacitor. Referring to FIG. 6C, capacitor stack 290 comprising a lower electrode layer 240, a ferroelectric film 260 and an upper electrode layer 280 is formed on the second insulating layer 200 having the first contact plugs 220a–d and second contact plug 220e.

Next, a photolithographic process is carried out to pattern the capacitor stack 290. Photoresist layer pattern 300 is formed on the upper electrode layer 280. Using the photoresist layer pattern 300 as a mask, the capacitor stack, i.e., upper electrode layer 280, ferroelectric film 260 and lower electrode layer 240 are patterned to form ferroelectric capacitors 320a, 320b, 320c and 320d at the cell array region electrically connected to selected first contact plugs 220a–d, as illustrated in FIG. 6D. At this time, it should be noted that dummy capacitor 320e is also formed at the dummy cell region electrically connected to the second contact plug 220e.

According to the second embodiment of the present invention, dummy capacitor 320e is electrically connected to the impurity diffusion region of the second active region 120c of the dummy cell region through the second contact plug 220e. Accordingly, charges stored in the dummy capacitor during plasma etching can be discharged into the impurity diffusion region of the second active region 120c.

As described above, according to one aspect of the present invention, a dummy capacitor is simultaneously formed on the dummy cell region provided at a periphery of the cell array region when ferroelectric capacitors are formed in the cell array region. Accordingly, plasma etching damage and the charging up phenomenon can be mainly concentrated on the dummy capacitor, to thus be minimized at the outermost ferroelectric capacitor of the cell array region. As a result, ferroelectric capacitors with uniform and stable ferroelectric characteristic can be obtained.

According to another aspect of the present invention, an active region is also defined at the dummy cell region, and an electrical current path between the active region and the dummy capacitor is formed. Accordingly, charges stored within the dummy capacitor discharge into the active region through the electrical current path. As a result, plasma etching damage can be easily blocked.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device comprising:
   a semiconductor substrate having a cell array region and a dummy cell region provided at a periphery of the cell array region;
   a first active region formed in the semiconductor substrate at a selected portion of the cell array region;
   an interlayer insulating layer formed on an entire surface of the semiconductor substrate including the first active region;
   a first contact plug formed in a selected portion of the interlayer insulating layer and electrically connected to the first active region;
   a ferroelectric capacitor and a dummy ferroelectric capacitor formed on the interlayer insulating layer, the ferroelectric capacitor being formed over the cell array region and being electrically connected to the first contact plug, and the dummy ferroelectric capacitor being formed over the dummy cell region;
   a second active region formed in the semiconductor substrate at a selected portion of the dummy cell region; and
   a second contact plug penetrating a selected portion of the interlayer insulating layer and being electrically connected to the second active region,
   a lower electrode of the dummy ferroelectric capacitor being electrically connected to the second contact plug to form an electrical path from the dummy ferroelectric capacitor to the second active region.

2. The semiconductor device according to claim 1, wherein the ferroelectric capacitor and the dummy ferroelectric capacitor comprise a lower electrode, a ferroelectric film and an upper electrode in order on the interlayer insulating layer, the lower electrode of the ferroelectric capacitor being in contact with the first contact plug.

3. The semiconductor device according to claim 2, wherein the ferroelectric film is selected from a group consisting of PZT, PLT, PLZT, SBT, BT, and BLT.

4. The semiconductor device according to claim 1, wherein the interlayer insulating layer comprises:
   a transistor formed on the first active region;
   a first insulating layer formed on the transistor and the entire surface of the semiconductor substrate;
   a bit line formed on the first insulating layer; and
   a second insulating layer formed on the first insulating layer and the bit line,
   the bit line penetrating the first insulating layer and being electrically connected to the first active region on one side of the transistor, and the first contact plug penetrating selected portions of the first and second insulating layers and being electrically connected to the first active region on another side of the transistor.

* * * * *